United States Patent
Feiweier (10) Patent No.: US 11,262,426 B2
(45) Date of Patent: Mar. 1, 2022

(54) METHOD AND SYSTEM FOR SIMULTANEOUS MULTI-SLICE NUCLEAR SPIN TOMOGRAPHY

(71) Applicant: Siemens Healthcare GmbH, Erlangen (DE)

(72) Inventor: Thorsten Feiweier, Poxdorf (DE)

(73) Assignee: Siemens Healthcare GmbH, Erlangen (DE)

( * ) Notice: Subject to any disclaimer, the term of this patent is extended or adjusted under 35 U.S.C. 154(b) by 32 days.

(21) Appl. No.: 16/804,450

(22) Filed: Feb. 28, 2020

(65) Prior Publication Data
US 2020/0278407 A1 Sep. 3, 2020

(30) Foreign Application Priority Data

Feb. 28, 2019 (DE) .......................... 102019202748.2

(51) Int. Cl.
 *G01V 3/00* (2006.01)
 *G01R 33/483* (2006.01)
 *G01R 33/561* (2006.01)

(52) U.S. Cl.
 CPC ...... *G01R 33/4835* (2013.01); *G01R 33/5611* (2013.01); *G01R 33/5615* (2013.01)

(58) Field of Classification Search
 CPC .............. G01R 33/543; G01R 33/5659; G01R 33/3415; G01R 33/36; A61B 5/055
 USPC ........................................................ 324/309
 See application file for complete search history.

(56) References Cited

U.S. PATENT DOCUMENTS

| 8,405,395 B2 | 3/2013 | Setsompop et al. |
| 2011/0080168 A1* | 4/2011 | Fenchel ............... A61B 6/5247 324/309 |
| 2014/0073964 A1* | 3/2014 | Rodriguez-Llorente .................... A61B 5/14552 600/479 |

(Continued)

FOREIGN PATENT DOCUMENTS

WO 2018213358 A1 11/2018

OTHER PUBLICATIONS

German Action dated May 18, 2020, Application No. 10 2019 202 748.2, and English translation attached.

(Continued)

*Primary Examiner* — Walter L Lindsay, Jr.
*Assistant Examiner* — Frederick Wenderoth
(74) *Attorney, Agent, or Firm* — Schiff Hardin LLP (57) ABSTRACT

A system and method for simultaneous multi-slice nuclear spin tomography is provided which requires no sensitivity profile of a receiving coil along a slice axis. A pulse space region to be sampled can be specified. A first pulse space dimension ($k_y$) can be assigned to a first phase-encoded axis and a second pulse space dimension ($k_z$) can be assigned to a second phase-encoded axis and the second phase-encoded axis corresponds to the slice axis. A sampling scheme can also be specified, and a complete sampled can be provided along the second pulse space dimension ($k_z$). A magnetic resonance scan can then be carried out within the pulse space region to be sampled based on the sampling scheme and respective phase-encodings of the first and second phase-encoded axis.

16 Claims, 3 Drawing Sheets

(56) References Cited

U.S. PATENT DOCUMENTS

| | | | |
|---|---|---|---|
| 2014/0266191 A1* | 9/2014 | Sveinsson | G01R 33/56563 |
| | | | 324/309 |
| 2016/0054411 A1* | 2/2016 | Mugler | G01R 33/4833 |
| | | | 324/309 |
| 2018/0031659 A1 | 2/2018 | Bhat et al. | |

OTHER PUBLICATIONS

Breuer Felix et al.: "CAIPIRINHA-Revisited"—MAGNETOM Flash (63) 2015, pp. 8-15; www.siemens.com/magnetom-world; 2015.

Wang D. et al.: "Multiband Slice Accelerated TSE for High Resolution Knee Imaging"; Proceedings of the International Society for Magnetic Resonance in Medicine, Joint Annual Meeting ISMRM-ESMRMB; No. 1216; p. 1216, XP040662285; 2014.

Gagoski, Borjan A. et al. "RARE/Turbo Spin Echo Imaging with Simultaneous Multislice Wave—CAIPI" Magnetic Resonance in Medicine; vol. 73; pp. 929-938; 2015 // DOI: 10.1002/mrm.2561.

Fritz, Jan et al. "Simultaneous Multislice Accelerated Turbo Spin Echo Magnetic Resonance Imaging: Comparison and Combination With in-Plane Parallel Imaging Acceleration for High-Resolution Magnetic Resonance Imaging of the Knee" Investigative Radiology, vol. 52, No. 9, pp. 529-537, Sep. 2017 // Doi: 10.1097/RLI.0000000000000376.

Barth, Markus et al. "Simultaneous Multislice (SMS) Imaging Techniques", Magnetic Resonance in Medicine, vol. 75, pp. 63-81, 2016 // DOI: 10.1002/mrm.25897.

Wang D. et al.: "High Resolution T2-weighted Imaging with Whole Brain Coverage at 7 Tesla using Multiband Slice Accelerated Spin Echo"; Proceedings of the International Society for Magnetic Resonance in Medicine, Joint Annual Meeting ISMRM-ESMRMB; No. 2677; p. 2677; 2013.

Zahneisen, Benjamin et al. "Three-Dimensional Fourier Encoding of Simultaneously Excited Slices: Generalized Acquisition and Reconstruction Framework" Magnetic Resonance in Medicine, vol. 71, No. 6, pp. 2071-2081, Jun. 2014 // https://doi.org/10.1002/mrm.24875.

German Action dated Jan. 20, 2020, Application No. 10 2019 202 748.2 (with English machine translation).

* cited by examiner

METHOD AND SYSTEM FOR SIMULTANEOUS MULTI-SLICE NUCLEAR SPIN TOMOGRAPHY

CROSS REFERENCE TO RELATED APPLICATIONS

This patent application claims priority to German Patent Application No. 102019202748.2, filed Feb. 28, 2019, which is incorporated herein by reference in its entirety.

BACKGROUND

Field

The disclosure relates to a method for simultaneous multi-slice nuclear spin tomography, whereby a pulse space region to be sampled is specified by means of a processor, whereby a first pulse space dimension is assigned to a first phase-encoded axis. The disclosure further relates to a system for simultaneous multi-slice nuclear spin tomography with a magnetic resonance tomography device and a processor, a computer program and a computer-readable storage medium.

Related Art

In the last few years, methods for the rapid recording of magnetic resonance (MR) images by simultaneous excitation of a plurality of slices have become established. Thereby, a plurality of slices can be imaged within the same time in which otherwise just one slice would have been recorded. In particular, in this regard, methods for simultaneous multi-slice (SMS) imaging are used in which, for example, concepts of parallel imaging (e.g. GRAPPA, SENSE) can be applied to a slice encoding direction. SMS technology is usable in many ways for different imaging methods, such as spin echo imaging or gradient echo imaging.

As described in U.S. Pat. No. 8,405,395 B2, for methods with single excitation in echoplanar image acquisition or "single shot echoplanar imaging" (SS-EPI), the signals of simultaneously applied slices are manipulated such that a targeted mutual displacement of the overlaid slice images in the position space results.

For a separation of simultaneously recorded slice images, it is necessary according to known methods that the receiving coils used have sufficiently strongly localized sensitivity profiles along the slice normals, since otherwise residual aliasing artifacts or increased image noise are observed. In particular, the recording of slice stacks of small extent or with only a few slices, for example, in the case of a sagittal imaging of a spinal column, this occurs to an increased extent.

In particular in the case of imaging with low main field strengths, such as can be used, for instance, in anatomical imaging, a signal-to-noise ratio (SNR) can be particularly low. This can be countered by averaging over a plurality of recordings, although it leads to a correspondingly large time expenditure.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure.

An object of the present disclosure is to provide an improved concept for simultaneous multi-slice nuclear spin tomography in which a sensitivity profile along the slice axis for receiving coils can be dispensed with.

The improved concept is based upon the idea of undertaking a phase-encoding along the slice axis, along which the slices to be simultaneously excited are arranged, and to combine it with a complete sampling along the slice axis.

According to a first independent aspect of the improved concept, a method for simultaneous multi-slice nuclear spin tomography, SMS is provided. According to the method, a pulse space region to be sampled is specified by means of a processor, whereby a first pulse space dimension is assigned to a first phase-encoded axis and a second pulse space dimension is assigned a second phase-encoded axis. Thereby, the second phase-encoded axis corresponds to a slice axis. In particular, the first phase-encoded axis lies perpendicularly to the slice axis. A sampling scheme is specified by means of the processor, whereby at least along the second pulse space dimension, a complete sampling is provided. Then a magnetic resonance scan, in particular, by means of a magnetic resonance tomography device is carried out within the pulse space region to be sampled according to the sampling scheme and according to respective phase-encodings of the first and second phase-encoded axis.

The pulse space can also be designated k-space, as is often the case in the context of magnetic resonance tomography.

The expression tomography thereby denotes the imaging of an object, or of its spatial structure in the form of slice images. In particular, the improved concept is not restricted to medical applications.

The pulse space region can be, in particular, a three-dimensional pulse space region or a two-dimensional pulse space region, in particular a sub-space region of the three-dimensional pulse space region. In the case of a three-dimensional pulse space region, a third pulse space dimension can be assigned to a third phase-encoded or frequency-encoded axis, whereby the third axis lies, in particular, perpendicularly to the first and the second axis.

The specification of the pulse space region to be sampled includes, for example, a specification of an extent of the pulse space region to be sampled and a discretization of the pulse space region, that is, a specification of discrete points in the pulse space with defined spacings along the two or three dimensions of the pulse space, which points should be sampled during the course of a scan.

The specification of the pulse space region to be sampled takes place, for example, on the basis of a pre-defined image region to be acquired in the position space, also called the "field of view" (FOV). The specification of the pulse space region to be sampled can take place, for example, taking account of or adhering to the sampling theorem, also called the Nyquist theorem or the Nyquist-Shannon sampling theorem.

The discretization of the pulse space region to be sampled can take place, for example, in that a spacing between two adjacent discrete points in the pulse space along a pulse space dimension corresponds specifically to the inverse of an extent of the FOV along the associated position space dimension. Alternatively, the spacing can be reduced according to an oversampling factor.

The specification of the pulse space region can take account of symmetries of the pulse space, for example, in order to reduce the extent of the pulse space region to be sampled.

A "phase-encoded axis" or "frequency-encoded axis" can be understood, for example, as an axis along which a spatial encoding is realized during the magnetic resonance scan, which corresponds to a phase-encoding or a frequency-encoding.

The slice axis can be, for example, a spatial direction along which the two or more slices that are to be simultaneously excited are arranged, so that the slice axis lies perpendicularly to the respective slice planes.

The first axis can correspond, for example, to a position space dimension parallel to the slice planes, that is, perpendicular to the slice axis. The same applies, if relevant, to the third axis.

The fact that along the second pulse space dimension a complete sampling is provided can mean, for example, that the sampling takes place completely within the context of the sampling theorem. This means that for each pulse space coordinate of the first pulse space dimension for which at least one pulse space coordinate of the second pulse space dimension is sampled, at least half, in particular a half comprising pulse space coordinates from a pulse space coordinate furthest removed from a center of the second pulse space dimension as far as to the center of the second pulse space dimension, all the associated pulse space coordinates of the second pulse space dimension are sampled, in particular gaplessly.

In particular, the complete sampling along the second pulse space dimension also allows a restriction of the pulse space region to be sampled along the second pulse space dimension in the context of a "partial Fourier" sampling, making use of known symmetries of the pulse space.

The sampling along the first pulse space dimension can, depending upon the sampling scheme, take place incompletely or completely.

By means of the specification of the sampling scheme, it is thus defined, for example, which of the discrete points of the pulse space region to be sampled are sampled.

By means of the combination of the SMS with the phase encoding and complete sampling along the slice axis, the improved concept permits a use of the SMS technique even in such cases in which respective receiving coils of the magnetic resonance tomography device have no defined sensitivity profiles along the slice normals and accordingly also in cases of particularly thin slice stacks and/or slice stacks with few slices. In particular, a method according to the improved concept has the advantages that a spacing of the simultaneously excited slices from one another is virtually insignificant.

In particular, this can be advantageous in the case of an imaging with relatively low main field strengths, for example of 1.5 T or less, in particular, for an anatomical imaging. In particular, multiple repetition of scan sequences can be at least partially dispensed with, since according to the improved concept, the SMS technique can already achieve a sufficiently high signal-to-noise ratio (SNR).

In an exemplary embodiment of the method, an incomplete sampling is provided along the first pulse space dimension. By this means, a further acceleration of the image acquisition is enabled and the magnetic resonance scan can be carried out in a shorter time.

In an exemplary embodiment of the method, through the specification of the sampling scheme, coordinate pairs to be sampled are determined, whereby each coordinate pair contains a first coordinate in relation to the first pulse space dimension and an associated second coordinate in relation to the second pulse space dimension.

In the following, the first pulse space dimension is denoted as the $k_y$-axis or -direction and the associated pulse space coordinates as $k_y$-coordinates or y-coordinates. The second pulse space dimension is denoted as the $k_z$-axis or -direction and the associated pulse space coordinates as $k_z$-coordinates or z-coordinates. The third pulse space dimension is denoted as the $k_x$-axis or -direction and the associated pulse space coordinates as $k_x$-coordinates or x-coordinates.

Each coordinate pair of the determined coordinate pairs to be sampled defines the y- and z-coordinates of the points to be sampled in the pulse space region. Accordingly, one or more x-coordinates belong to each pair of y- and z-coordinates. In particular, the coordinate pairs to be sampled contain all the combinations to be sampled from y-, z-coordinates, so that together with the associated x-coordinates, all the points to be sampled are defined in the pulse space region.

The coordinate pairs can be placed and stored, for example, in a list. A sequence of the coordinate pairs in this list does not necessarily correspond at this point to an actual temporal sequence of samplings during the magnetic resonance scan. The coordinate pairs placed in the list can be stored as dimensionless coordinate pairs, whereby the corresponding pulse values result from a multiplication of the respective dimensionless coordinates by an associated pulse increment according to the sampling theorem, which is thus, in particular, equal to an inverse of the corresponding extent, possibly taking account of the oversampling factor of the associated image region.

Thus, for example, a systematic allocation of all the points to be sampled in the pulse space region is possible. In particular, the second pulse space dimension assigned to the slice axis is treated similarly to the first pulse space dimension.

In an exemplary embodiment, for the performance of the magnetic resonance scan, scan signals are recorded during associated recording time periods. Each recording time period is assigned according to a segmentation scheme to one, in particular exactly one, excitation pulse so that at least one segmentation index is unambiguously assigned to each recording time period.

The segmentation scheme corresponds, for example, to an assignment of the recording time periods to one or more excitation pulses and/or to one or more refocusing pulses.

Accordingly, the segmentation scheme can be identified or defined by one of more segmentation indices. The segmentation indices can contain, for example, an echo index which numbers or indicates the associated recording time periods for a given excitation pulse. The segmentation indices can also contain an excitation index, in particular if a plurality of excitation pulses are applied, that is, if in particular, an MS ("multi-shot") technique is used. The excitation index then indicates or numbers the different excitation pulses. The segmentation indices can also contain a refocusing index, in particular if according to the image acquisition, a plurality of refocusing pulses is used. The refocusing index then indicates or numbers the individual refocusing pulses.

A tuple of segmentation indices is thus unambiguously assigned to each recording time period, called below a segmentation tuple, whereby the segmentation tuple can be a 1-tuple, a 2-tuple, a 3-tuple and so on, depending on the complexity of the segmentation scheme.

The scan signals are, in particular, scan signals, which can also be designated echo signals.

The excitation pulse is, in particular, a high frequency pulse which serves to tilt nuclear spins by an angle, in particular, an Ernst angle, for example by 90°, in particular out of an alignment along the slice axis.

In the context of an SS-EPI, for example, all the recording time periods are assigned to a single excitation pulse. In the context of MS recordings, the recording time periods are divided, for example evenly, among one or more excitation pulses.

By means of the assignment of the recording time periods to the segmentation index, a temporal sequence of the recording time periods is defined such that a temporal sequence of the recording time periods correspond to a sequence of the segmentation indices. In the case of only one index, the sequence corresponds directly to the index. In the case of two indices, one of the indices defines a sequence of groups of recording time periods and a second index defines a sequence within the respective groups. This can be continued similarly, for a plurality of indices.

In an exemplary embodiment, an object of the segmentation to prevent long signal evolution times. The latter can lead to signal loss, for example, by means of relaxation effects and/or accumulation of undesirable signal phases, for example, due to non-ideal recording conditions.

Advantageously, according to the improved concept, any desired segmentations, including multiple segmentations, are possible.

According to at least one embodiment, each recording time period is assigned to a refocusing pulse according to the segmentation scheme, so that at least two segmentation indices are unambiguously assigned to each recording time period.

The at least two segmentation indices can contain, for example, the echo index and the excitation index or the echo index and the refocusing index.

The refocusing pulses involve, in particular, 180° high frequency pulses. A refocusing pulse serves to rotate the nuclear spin about an axis that lies perpendicularly to the alignment of the main magnetic field, by 180°. For each excitation pulse, for example, no, one or a plurality of refocusing pulses can be provided.

Advantageously, the improved concept can thus also be used for image acquisition concepts and segmentations with refocusing pulses. Thereby, a cumulative influence of field inhomogeneities, interference through differences of magnetic susceptibility at tissue boundaries or movements of an object under examination can be compensated for or prevented.

According to at least one embodiment, for carrying out the magnetic resonance scan, each coordinate pair is assigned to exactly one tuple of segmentation indices in order to define a sequence of a sampling of the coordinate pairs during the magnetic resonance scan.

Each combination of y and z-coordinates to be sampled in the pulse space region to be sampled is thus assigned to a segmentation tuple, that is, as a consequence exactly one recording time period.

The tuple of segmentation indices can also be a tuple with only one segmentation index, that is, a 1-tuple which contains, for example, the echo index.

Through the assignment of the coordinate pairs to the segmentation tuples, a sequence of the sampling of the different y- and z-points in the pulse space region is defined.

According to at least one embodiment, in particular during the magnetic resonance scan, at least one gradient moment is applied between samplings of two successive coordinate pairs according to the sequence, the value of which is determined from at least one pulse difference between the successive, in particular immediately successive, coordinate pairs.

If the successive coordinate pairs have, for example, different y-coordinates, then a y-gradient moment arises directly from the difference between the y-coordinates of the successive coordinate pairs. In particular, the y-gradient moment is provided by a pulse difference in the y-direction of the successive coordinate pairs divided by the gyromagnetic ratio of the nuclear spin under examination.

If the successive coordinate pairs have, for example, different z-coordinates, then a z-gradient moment to be applied arises directly from the pulse difference in the z-direction of the successive coordinate pairs. In particular, the z-gradient moment is provided by the pulse difference in the z-direction of the successive coordinate pairs divided by the gyromagnetic ratio of the nuclear spin under examination.

Through the definition of the gradient moments, a sampling path or a sampling route is enabled within the pulse space region to be sampled.

Embodiments of the improved concept thus offer a simple, flexible and universal scheme for determining the gradient moments, in particular for different MS image acquisition variants. The gradient moments thereby result directly from the sequence of the samplings of the coordinate pairs by the assignment of the coordinate pairs to the tuples from segmentation indices.

According to at least one embodiment, between the application of an excitation pulse and a sampling of a coordinate pair following directly after the excitation pulse, at least one pre-phasing moment is applied, the value of which is determined from at least one pulse difference between the coordinate pair following the excitation pulse and at least one reference pulse value.

The reference pulse values can be, in particular, pulse values corresponding to a pulse space center, in particular, a pulse space center in the y-z plane.

The value of the pre-phasing moment is given, in particular, by the spacings of the coordinates of the coordinate pair from the reference pulse values divided by the gyromagnetic ratio of the nuclear spin under examination.

By means of the pre-phasing moment, starting from the reference pulse values, a point corresponding to the coordinate pair in the pulse space can be approached. The improved concept thus also provides, in a systematic manner, the pre-phasing moments directly from the sequence of the sampling of the coordinate pairs and of the assignment of the coordinate pairs to the segmentation indices.

According to at least one embodiment, between a sampling of a coordinate pair and a subsequent further excitation pulse or a subsequent refocusing pulse, a re-phasing moment is applied, the value of which is determined from at least one pulse difference between the coordinate pair sampled before the further excitation pulse or the refocusing pulse and the at least one reference pulse value.

The value of the re-phasing moment is given from respective differences or spacings of the coordinates in the pulse space of the coordinate pair from the respective reference pulse values.

The re-phasing moments serve, for example, to approach the center of the pulse space and/or the reference pulse values before the application of a further excitation pulse. This serves, for example, to create defined starting conditions, which is advantageous, in particular, in the case of multiple refocusing.

In an exemplary embodiment, the values of the re-phasing moments thus also result, in a systematic manner and directly from the sequence of the samplings of the coordinate pairs and of the assignment of the coordinate pairs to the segmentation indices.

According to at least one embodiment, at the center or the effective center of each excitation pulse, an effect of an applied gradient moment to the signal evolution comes about. Thus, at this time point, by definition, the corresponding y- and z-coordinates are equal to zero.

According to at least one embodiment, at the middle or the effective middle of each refocusing pulse, a current state of the signal evolution is inverted in that all the microscopic magnetic moments are rotated about an axis of the HF pulse by 180°. Thus, at this time point, by definition, the y- and z-coordinates are inverted.

According to at least one embodiment, for specifying the pulse space region to be sampled, the third pulse space dimension is assigned to a third phase-encoded axis or a third frequency-encoded axis. The magnetic resonance scan is carried out according to a phase-encoding of the third phase-encoded axis or according to a frequency-encoding of the third frequency-encoded axis.

Apart from a frequency-encoding in the x-direction, the improved concept is thus also usable on a two-dimensional phase-encoding within the slice plane in combination with a phase-encoding along the slice axis. This can be advantageous, for example, for an SMS of a chemical shift, or "chemical shift imaging" (CSI), in which processing within the slice plane, for example, with two phase-encoded gradients takes place. The data is thus recorded here without a gradient field connected in parallel, in order to obtain additional spectroscopic information.

According to at least one embodiment, in the performance of the magnetic resonance scan, a plurality of slices are excited simultaneously along the slice axis.

The simultaneously excited slices involve, in particular, spatially separated slices, that is, a non-continuous or discrete excitation region.

The simultaneous excitation takes place, in particular, by application of a slice-selection gradient moment along the z-direction and a corresponding embodiment of the excitation pulse. The slice-selection gradient moment is applied, in particular, during the excitation.

Thereby, in particular, a time saving in relation to individual slice excitation and a sequential series of a plurality of single slice excitations is achieved.

According to at least one embodiment, the magnetic resonance scan is carried out in accordance with a spin echo image acquisition or according to a turbo spin echo image acquisition, SS-TSE or MS-TSE or according to a gradient and spin echo image acquisition, SS-GRASE or MS-GRASE or a gradient and turbo spin echo image acquisition.

TSE imaging methods are particularly advantageous due to their high speed, robustness, image quality and flexible contrast formation. In particular, if limitations of a specific absorption rate play no decisive part in the object to be imaged, the high efficiency of the TSE technique comes into effect. This can be the case, in particular, with low main field strengths, for instance, in the region of 1.5 T or less. The combination of TSE and SMS with complete sampling of the phase-encoded slice axis makes it possible to dispense at least partially with repetitions of the scan sequences and nevertheless to achieve an adequate SNR.

According to at least one embodiment, on specification of the pulse space region to be sampled, the pulse space region to be sampled is restricted along the second pulse space dimension according to a partial Fourier restriction.

Thereby, in particular, a symmetry of the pulse space is utilized. The symmetry goes back to the real-valued status of an image signal to be reproduced. Since the image signal has, for example, no real values, a Fourier transform of the image signal is such that in the y-z plane of the pulse space, points arranged with point symmetry round the pulse space center correspond to complex conjugated values of the Fourier transform. Utilizing this symmetry, up to 50% of the z-coordinates to be sampled according to the sampling theorem can be spared.

According to a further independent aspect of the improved concept, a system for simultaneous multi-slice nuclear spin tomography is provided. The system has a magnetic resonance tomography device and a processor. The processor is configured to specify a pulse space region that is to be sampled, whereby a first pulse space dimension is assigned to a first phase-encoded axis. A second pulse space dimension is assigned to a second phase-encoded axis and the second phase-encoded axis corresponds to a slice axis. The processor is also configured to specify a sampling scheme, whereby along the second pulse space dimension, a complete sampling is provided. The magnetic resonance tomography device is configured, in particular, activated by the processor, to carry out a magnetic resonance scan within the pulse space region to be sampled according to the sampling scheme and according to respective phase-encodings of the first and second phase-encoded axis.

Further embodiments of the system for simultaneous multi-slice nuclear spin tomography follow directly from the different embodiments of the method for simultaneous multi-slice nuclear spin tomography according to the improved concept.

According to a further independent aspect of the improved concept, a computer program is provided which has commands which, on execution of the computer program by a system according to the improved concept, in particular, by a processor of a system according to the improved concept, cause the system to carry out a method according to the improved concept.

According to a further independent aspect of the improved concept, a computer-readable storage medium is provided on which a computer program according to the improved concept is stored.

Magnetic resonance data is typically recorded in a defined inverse space by means of gradient moments $M_{x/y/z}$, also referred to as the pulse space or k-space. For the pulse space coordinates, $k_{x/y/z} = \gamma \int dt \, G_{x/y/z}(t)$ applies, where $\gamma$ denotes the gyromagnetic ratio of the examined nuclear spin and the time integral is calculated over the gradient amplitudes $G_{x/y/z}$ applied from the time point of the excitation of transverse magnetization. From the data recorded for the pulse space coordinates, the images can then be calculated by Fourier transform in the position space coordinates.

A discretization of the data recorded can be described, for example, by means of a comb function, that is, via a sum of incrementally displaced Dirac functions. A complete sampling of a position space region of the extent $FOV_i$ with a resolution of $N_i$ points requires an increment $\Delta k_i = 1/FOV_i$. In this way, signal contributions of spins at the spacing $FOV_i$ are displaced precisely by $2\pi$ relative to one another and all positions within $FOV_i$ have a clearly assignable phase.

Through optional oversampling according to an oversampling factor $OS_i$ (0 represents no oversampling, 1 represents 100% oversampling), there results $\Delta k_i = 1/(FOV_i *(1+OS_i))$.

In magnetic resonance imaging, for a spatial encoding within the slice plane (for example, the x-y plane) frequency-encoding and/or phase-encoding are used, for example, a frequency-encoding along the x-axis and a phase-encoding along the y-axis.

For the phase-encoding, before the data recording, a, for example, constant magnetic field with a defined, for example, linear position-dependency is switched for a specified time duration. By means of repeated recordings with, for example, different time durations and/or gradient amplitudes, the necessary pulse space coordinates can be realized.

For a frequency-encoding, during the data recording, a, for example, constant magnetic field with a defined, for example, linear position-dependency is switched. Data points recorded at a particular temporal spacing following one another then differ specifically by a pulse space increment which is given by the temporal spacing multiplied by the aforementioned gyromagnetic ratio and the corresponding gradient amplitude. Through a suitable selection of gradient amplitudes and temporal spacing, a pulse space increment can be realized which corresponds to the desired $FOV_x$ and $OS_x$. An optional additional gradient moment before the data recording (pre-phasing moment) can ensure the suitable initial pulse space coordinates.

The phase-encoding along the slice axis according to the improved concept creates the foundation for a simple, unified and extremely flexible determination of blip patterns and pre-phasing and re-phasing moments of the gradient fields to be applied. In different exemplary embodiments of the improved concept, according to the sampling theorem, $k_y$ and $k_z$ pulse space coordinates that are to be completely sampled are specified, whereby one of the coordinates, in particular the $k_z$-coordinate corresponds to an SMS encoding along the slice axis.

For example, after specifying a sampling scheme and determining the pairs of pulse space coordinates to be sampled and specifying a segmentation scheme which is identified by one or more segmentation indices, each pair of pulse space coordinates can be assigned to a tuple of segmentation indices.

The magnetic resonance scan can then be carried out, whereby each data recording is unambiguously assigned to a tuple of segmentation indices, therefrom the corresponding pair of nearest pulse space coordinates is determined and from current and nearest pulse space coordinates, required increments, in particular gradient moments, are determined. Finally, gradient moments which realize the necessary increments are switched.

In different embodiments, it is the case that at the effective center of a high-frequency excitation pulse, y- and z-pulse space coordinates are zero in each case and at the effective center of a high-frequency refocusing pulse y- and z-pulse space coordinates are inverted and therebetween a development takes place according to $k_{y/z} = \gamma \int dt \, G_{y/z}(t)$.

The remaining x-axis can also be treated similarly.

Figure 1:
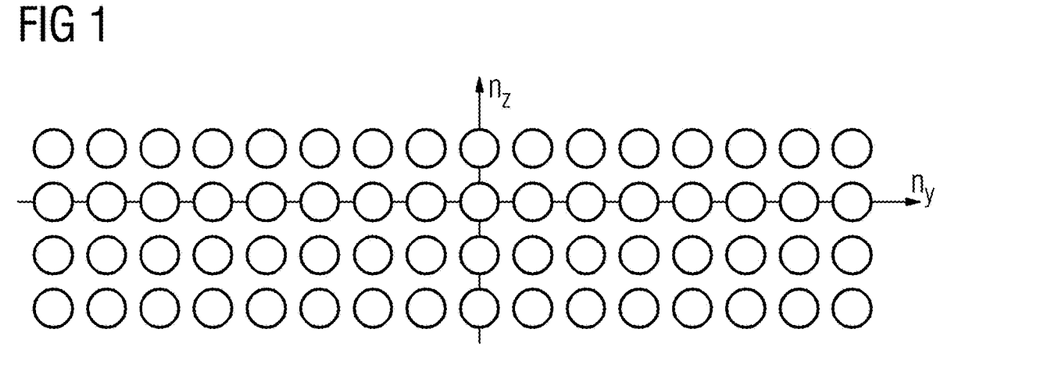
FIG. 1 illustrates a specified pulse space region according to an exemplary embodiment of an improved method.

FIG. 1 illustrates a method for simultaneous multi-slice nuclear spin tomography, SMS, according to an exemplary embodiment, to specify a pulse space region. FIG. 1 shows, on a horizontal axis, dimensionless y-coordinates $n_y$ which correspond to a pulse direction within a slice plane. On a vertical axis, dimensionless z-coordinates $n_z$ are represented, which correspond to a pulse direction along the slice axis. Each circle in FIG. 1 represents a discrete point $(n_y, n_z)$ in the y-z plane of the pulse space. Similar applies also to FIGS. 2 and 3 and also to FIG. 5.

The numbers $n_y$ and $n_z$ number the corresponding coordinates along the y-axis and the z-axis. The number of the points along the axes and the actual pulse spacing between two adjacent points that correspond to the dimensionless points is given according to the sampling theorem from the corresponding extents of the image region, $FOV_{y/z}$, for example, according to $\Delta k_{x/y} = 1/(FOV_{y/z}*(1+OS_{y/z}))$.

The pulse space region shown relates, by way of example, to four simultaneously excited slices along the z-axis and sixteen image points within the slice plane along the y-axis.

Figure 2:
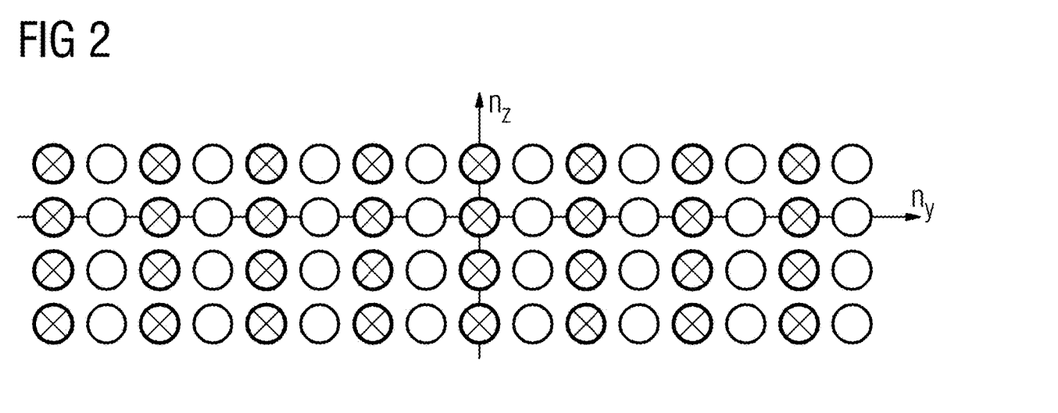
FIG. 2 illustrates a sampling scheme according to an exemplary embodiment of an improve method.
Figure 3:
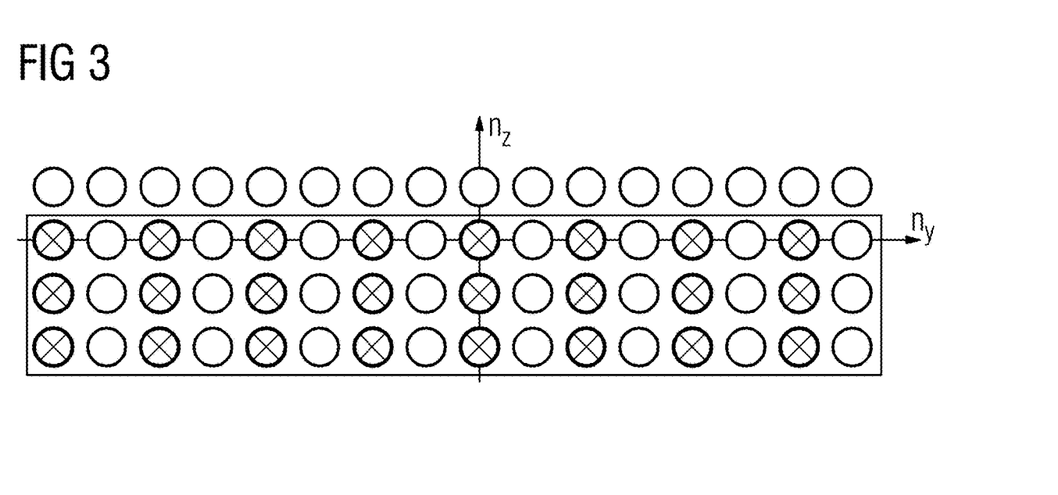
FIG. 3 illustrates a sampling scheme according to an exemplary embodiment of an improved method.

FIGS. 2 and 3 show different sampling schemes according to exemplary embodiments. Both have in common that a sampling along the z-direction is complete. Those points in the pulse space which are sampled according to the sampling scheme are identified with crosses, whilst empty circles correspond to points in the pulse space that are not sampled.

Regular sampling schemes can be determined, for example, by program means. Advantageously, the sampling scheme is selected or displaced such that both in the y- and also the z-direction, the center of the pulse space (that is $n_z = n_y = 0$) is actually sampled.

In FIG. 2, for example, a two-fold conventional undersampling along the y-axis is shown, whereby for each sampled y-coordinate, all the z-coordinates of the specified pulse space region are sampled. For each sampled z-coordinate, every second y-coordinate is sampled.

Thereby, initially missing information can be enhanced in the context of the image reconstruction using spatial sensitivity profiles of the receiving coils of the magnetic resonance tomography device along the coordinate axes within the slice plane, for example, determined by a dedicated reference scan with known methods (e.g. GRAPPA, SENSE).

With regard to FIG. 2, for the reconstruction of the image, a coil sensitivity profile in the y-direction can be required. Due to the complete sampling in the z-direction, however, a coil sensitivity profile in the z-direction is not required.

In FIG. 3, the same sampling scheme as in FIG. 2 is shown, whereby according to a partial Fourier restriction, indicated by a frame, the number of z-coordinates to be sampled has been restricted. In the example shown, only z-coordinates that are smaller than or equal to zero are sampled. As set out above, due to the symmetry of the pulse space for real position space signals, this restriction corresponds to no undersampling along the z-axis and thus, a complete sampling takes place along the z-axis as before. Alternatively or additionally, a conventional partial Fourier restriction can be selected for coordinate axes within the slice plane, for example, the y-axis.

Therefrom results a list of coordinate pairs $(n_y, n_z)$ to be sampled: (−8,−2)(−8,−1)(−8,0)(−6,−2)(−6,−1), (−6,0), (−4, −2), (−4,−1), (−4,0), (−2,−2), (−2,−1), (−2,0), (0,−2), (0,−1), (0,0), (2,−2), (2,−1), (2,0), (4,−2), (4,−1), (4,0), (6,−2), (6,−1), (6,0).

Figure 4:
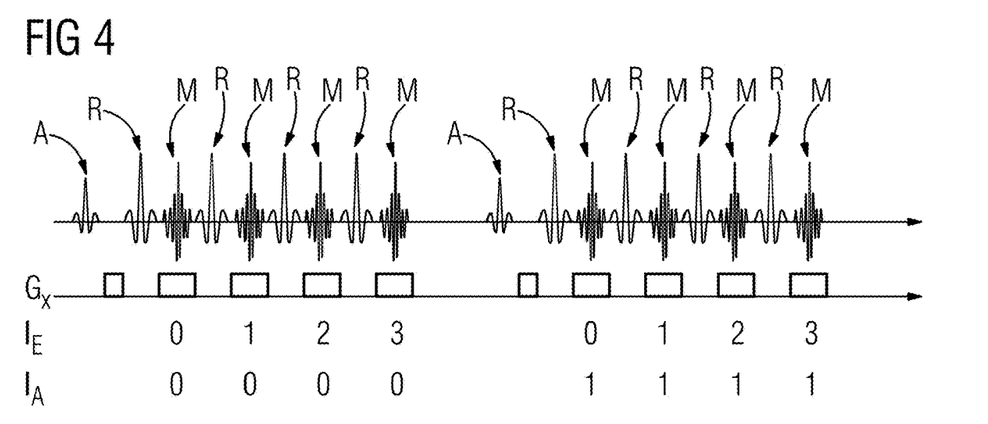
FIG. 4 illustrates a segmentation scheme according to an exemplary embodiment of an improved method.

FIG. 4 shows a segmentation scheme according to an exemplary embodiment which can be used in the context of the improved concept. What is shown is a TSE scan whereby the segmentation is identified by two segmentation indices, specifically an echo index $I_E$ and an excitation index $I_A$.

In the example shown, following each excitation pulse A is a plurality of recording time periods and scan signals M, for example four, whereby according to the TSE technique, before each scan signal M, a refocusing pulse R is applied.

It should be noted that the number of respective refocusing pulses per excitation pulse A or the number of the respective recording time periods and scan signals M per excitation pulse A and/or per refocusing pulse R can deviate in other recording techniques. In further recording techniques, refocusing pulses can be entirely dispensed with.

The echo index $I_E$ gives the number or position of the respective echo, that is, of the corresponding scan signal or of the associated recording time period, which follows an excitation pulse A. The excitation index $I_A$ characterizes the number of excitation pulses A or the position or sequence of the excitation pulse in relation to all the excitation pulses A. It should be noted herein that the number of excitation pulses A is naturally not restricted to two, but according to the actual requirements, can also be larger. Each tuple of echo index $I_E$ and excitation index $I_A$ accordingly denotes unambiguously one of the recording time periods or one of the scan signals M.

Each tuple of echo index $I_E$ and excitation index $I_A$ thus clearly characterizes a recording time period and an associated scan signal M. Due to the unambiguous assignment of each scan signal M to exactly one refocusing pulse R in the TSE recording, a refocusing index can be dispensed with herein.

Furthermore, in FIG. 4, a progression of a gradient amplitude $G_x$ along the x-axis, that is, in particular along the frequency-encoded x-axis, is shown. Surfaces which enclose the gradient amplitude $G_x$ with the time axis, produce the corresponding gradient moments.

The gradient moments contain, for example, a pre-phasing moment before the first of the scan signals M. Thereupon, during each recording time period, corresponding gradient amplitudes $G_x$ are switched in order to sample different points along the x-axis of the pulse space.

Figure 5:
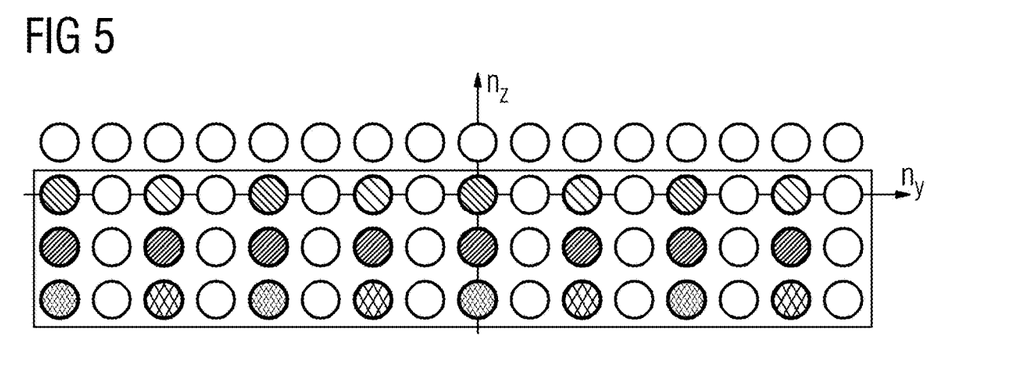
FIG. 5 illustrates a segmentation scheme according to an exemplary embodiment of an improved method.

In FIG. 5, an assignment of the pulse space coordinate pairs to respective tuples of segmentation indices is shown according to a segmentation scheme of FIG. 4. In principle, for example, any desired assignments can be selected between the pulse space coordinate pairs for y and z axes and segmentation tuples. For example, a nested loop can extend over each index of the segmentation indices and respectively the next coordinate pair from the list in which the coordinate pairs are stored can be removed and assigned. In an exemplary embodiment, a corresponding pseudocode can read as follows:

```
Element = 0
for ( Index_1 = 0 ... MaxIndex_1 )
{
    for ( Index_2 = 0 ... MaxIndex_2 )
    {
        ...
        Tuple = { Index_1, Index_2, ... }
        Assignment( Tuple) = L( Element )
        Element = Element + 1
    }
}
```

Taking account of the physics underlying magnetic resonance and the development of the magnetization over time, for example by means of the relaxation with relaxation times T1, T2, T2* or the successive construction of signal phases, it can however be useful to use the specifically adapted assignments.

For a TSE imaging, it can be advantageous for example, in particular, to undertake the assignment based upon a conventional 2D imaging. Thereby, for a first z-coordinate, initially all the y-coordinates to be sampled are sampled with a conventional assignment. This assignment is repeated with the further z-coordinates. Both rising, falling and also centered sorting along the y-axis can thus be realized in this way.

A corresponding rising sorting for six excitations and four echoes per excitation can be selected as follows, wherein "element" characterizes the position of the coordinate pair in the list described in relation to FIG. 3:

$I_E$: 0 1 2 3 0 1 2 3 0 1 2 3
$I_A$: 0 0 0 0 1 1 1 1 2 2 2 2
Element 0 6 12 18 1 7 13 19 2 8 14 20
$n_y$: −8 −4 0 4 −6 −2 2 6 −8 −4 0 4
$n_z$: −2 −2 −2 −2 −2 −2 −2 −2 −1 −1 −1 −1
$I_E$: 0 1 2 3 0 1 2 3 0 1 2 3
$I_A$: 3 3 3 3 4 4 4 4 5 5 5 5
Element 3 9 15 21 4 10 16 22 5 11 17 23
$n_y$: −6 −2 2 6 −8 −4 0 4 −6 −2 2 6
$n_z$: −1 −1 −1 −1 0 0 0 0 0 0 0 0

In alternative embodiments, other assignments are possible, for example those in which the sequence of the samplings of y- and z-coordinates are mixed with one another. Thus, in one excitation, a plurality of different z-coordinates can be sampled. A recording of all z-coordinates for one y-coordinate is also possible with one excitation.

Figure 6:
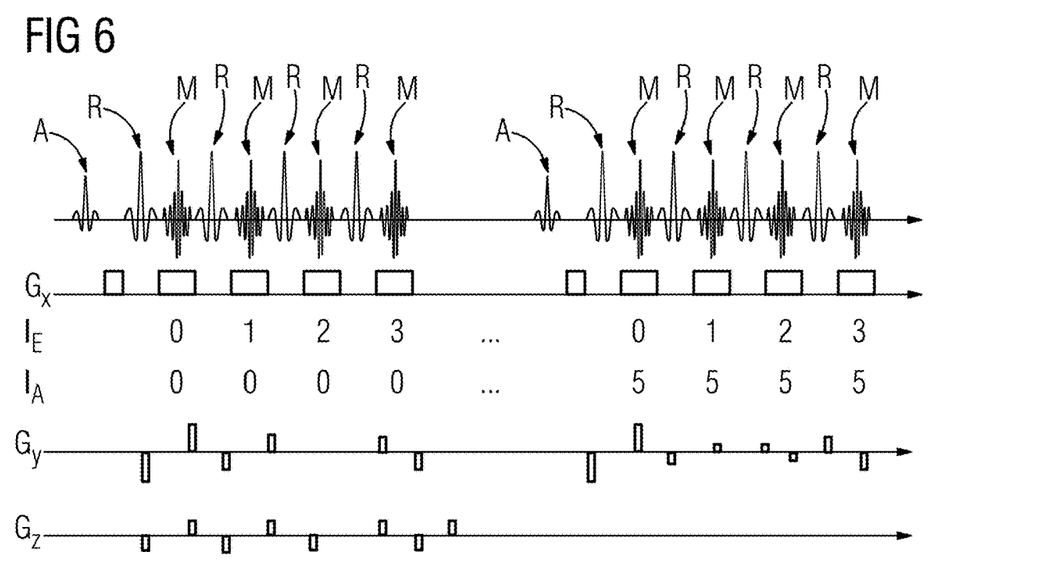
FIG. 6 illustrates a magnetic resonance scan according to an exemplary embodiment of an improved method.

FIG. 6 shows an exemplary scan sequence according to an exemplary embodiment of the improved concept with correspondingly determined gradient moments and gradient amplitudes $G_y$, $G_z$ along the y and z pulse space dimensions. As an example, the same combination of segmentation schemes and TSE scan is shown as in FIG. 5.

By means of the assignment, as described in relation to FIG. 5 and the pattern of the scan sequence, the tuple currently to be recorded results directly therefrom. By means of the list with the coordinate pairs, the pair of pulse space indices or pulses ($n_y'$, $n_z'$) to be set can thereby be determined unambiguously. Thus, the current pulse space indices ($n_y$, $n_z$) can be determined successively. The necessary gradient moments for the corresponding changes of the pulse space coordinates by ($n_y'-n_y$, $n_z'-n_z$) result directly from the relationship $M_{y/z}=(n'_{y/z}-n_{y/z})*\Delta k_{y/z}/\gamma$. Herein, $\Delta k_{y/z}$ corresponds to the relevant pulse space increments determined according to the sampling theorem and y corresponds to the gyromagnetic ratio.

Gradient amplitudes $G_y$, $G_z$, which are applied between successive recording time periods correspond to pre-phasing amplitudes or rephasing amplitudes and to gradient amplitudes (blips) required for the displacement of the y- and z-coordinates. In the manner described, the pulse space to be recorded can therefore be sampled systematically.

Figure 7:
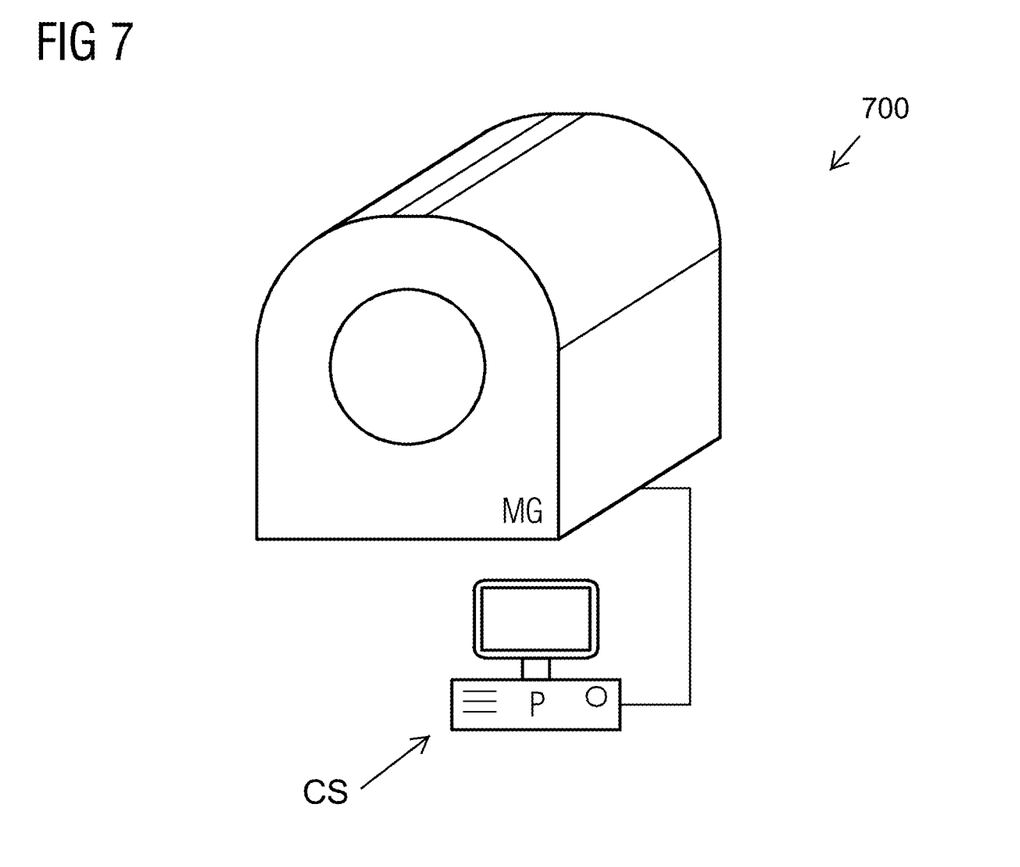
FIG. 7 illustrates of a system for simultaneous multi-slice nuclear spin tomography according to an exemplary embodiment.

FIG. 7 shows a schematic representation of an exemplary embodiment of a system according to the improved concept.

In an exemplary embodiment, the system 700 has a magnetic resonance tomography (MRT) device MG to which a computer system CS is coupled. The MRT device MG can also be referred to as an MRT scanner. In an exemplary embodiment, the computer system CS comprises a processor P. The computer system CS can also comprise a computer program according to the improved concept which can be carried out by the processor P. In an exemplary embodiment, the computer system CS is a controller that is configured to control the overall operation of the magnetic resonance tomography device MG. In an exemplary embodiment, the computer system CS includes processor circuitry that is configured to perform one or more operations and/or functions of the computer system CS.

In accordance with a method or a system according to the improved concept, the advantageous use of the SMS technique is also enabled in cases in which the receiving coils have no or an inadequate sensitivity profile along the slice normals, and in particular also in thin slice stacks with few slices. A sensitivity profile can be insufficient, for example, in this context if the spatial extent of the sensitivity profile is greater than the spacing between simultaneously excited slices. In particular, imaging with small main field strengths can benefit from the improved concept.

Known methods for three-dimensional nuclear spin tomography have the disadvantage that a single disturbance of the recording during the overall scanning time, for example, due to an object or patient movement, can lead to image artifacts in all the slices. Above all during a spin echo imaging, it must also be noted that successive excitations of the volume at a sufficiently long temporal spacing must take place in order to take account of the $T_1$ relaxation. This significantly restricts the efficiency of known three-dimensional recording methods. The combination of an SMS scan, that is, the simultaneous excitation of a plurality of spatially separate slices while using a phase encoding along the slice axis with a complete sampling along the slice normals according to the improved concept overcomes these disadvantages.

According to the improved concept, in particular, an undersampling along the slice axis, that is, the SMS encoding direction or slice normals is dispensed with and the focus is placed on increasing the SNR, independently of any sensitivity profiles along the slice normals and the spacings of simultaneously excited slices.

An advantage of the improved concept can also be found in the saving of averagings and/or concatenations. The following example illustrates this. A conventional $T_1$-weighted sagittal TSE imaging of a spinal column with a magnetic field of less than 1 T with 16 slices of 3 mm each with an intermediate space of 0.5 mm is considered, which thus corresponds to a slice spacing of 3.5 mm and a total extent of the slice block of 56 mm. Furthermore, a resolution of 1×1 mm² within this slice, a matrix of 448×448 points, a waiting time between recordings of 500 ms, an echo time of 12 ms and dispensing with an undersampling within the slice, that is for example, along the y-axis, are assumed. In such a case, in order to be able to realize a desired contrast, the slices must be distributed, for example, over two concatenations, each with eight slices. Within the 500 ms, each slice of a concatenation is excited once. With each excitation, four echoes are assumed. For the image recording, 448 echoes are needed per slice. An adequate SNR requires four averagings. This results, in the example given, in an overall scanning time of 7:28 min: 448/4 gives 112 excitations; 112*500 ms gives 56 s per concatenation (eight slices each); 2*56 s gives 112 s for all the slices (two concatenations); 4*112 s gives 7:28 min (four averagings).

In accordance with a method according to an exemplary embodiment, for example, two slices are excited simultaneously and all the slices are excited once within only one waiting time. In the example given, for the complete sampling of all the coordinates, 224 excitations per slice and averaging are necessary (for 2 z-coordinates and 448 y-coordinates, 896 echoes are required for a complete sampling; with four echoes per excitation, the 224 excitations follow). The simultaneous excitation of two slices, however, increases the SNR by a factor of √2, so that even with two averagings, an adequate SNR can be achieved. Due to the complete sampling along the slice axis, the low slice spacing has no influence on image artifacts nor causes an increase in the SNR. Finally, in this case, a significantly shortened scan time, as compared with a conventional recording, of 3:44 min at two averagings and only one concatenation can be achieved.

In general, the SNR is increased by the factor "root of the number of simultaneously excited slices".

Advantageously, a method according to the improved concept is less sensitive to a movement of the object to be recorded and is also flexibly applicable for spin echo or turbo spin echo scans.

The method according to the improved concept can realize, in particular, a complete sampling along the slice axis with segmented recording methods, for example, multi-segmented recording methods.

For conventional SMS imaging, it may be necessary for example, to record reference data for determining the coil sensitivity profile. According to the improved concept, this necessity which leads to a further reduction in the scan time does not apply.

The improved concept can advantageously be used for anatomical spin echo or turbo spin echo imaging, but is not limited thereto. It can also be used, for example, for multi-slice 2D GRE imaging or forms of steady state imaging, for example bSSFP, FISP, PSIF or TrueFISP or for combinations of GRE and TSE (GRASE) or for echoplanar imaging with one or more applications (ss-EPI, ms-EPI). Contrast preparations such as the selective suppression of fat or liquids (FLAIR, STIR, SPAIR, etc.) or imaging using phase information (SWI, MRE) can also be combined.

Any connection or coupling between functional blocks, devices, components of physical or functional units shown in the drawings and described hereinafter may be implemented by an indirect connection or coupling. A coupling between components may be established over a wired or wireless connection. Functional blocks may be implemented in hardware, software, firmware, or a combination thereof.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general purpose computer.

For the purposes of this discussion, the term "processor circuitry" shall be understood to be circuit(s), processor(s), logic, or a combination thereof. A circuit includes an analog circuit, a digital circuit, state machine logic, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A method for simultaneous multi-slice nuclear spin tomography using a magnetic resonance tomography (MRT) system having a MRT scanner and a controller, the method comprising:

specifying, by the controller of the MRT system, a pulse space region to be sampled by a processor of the controller, wherein a first pulse space dimension is assigned to a first phase-encoded axis, and assigning a second pulse space dimension to a second phase-encoded axis, the second phase-encoded axis corresponding to a slice axis;

specifying, by the controller, a sampling scheme, wherein a complete sampling is provided along the second pulse space dimension;

determining, by the controller, coordinate pairs to be sampled based on the specified sampling scheme, wherein each of the coordinate pairs contains a first coordinate in relation to the first pulse space dimension and an associated second coordinate in relation to the second pulse space dimension; and performing, by the MRT scanner, a magnetic resonance scan within the pulse space region to be sampled based on the sampling scheme and respective phase-encodings of the first and second phase-encoded axis, wherein performing the magnetic resonance scan comprises recording scan signals during associated recording time periods, each recording time period being assigned according to a segmentation scheme to an excitation pulse so that at least one segmentation index is unambiguously assigned to each recording time period.

2. A system for simultaneous multi-slice nuclear spin tomography, comprising:

a magnetic resonance tomography (MRT) scanner; and
a controller configured to:

specify a pulse space region to be sampled, a first pulse space dimension being assigned to a first phase-encoded axis;

assign a second pulse space dimension to a second phase-encoded axis and the second phase-encoded axis corresponds to a slice axis;

specify a sampling scheme, wherein a complete sampling is provided along the second pulse space dimension;

determine coordinate pairs to be sampled based on the specified sampling scheme, wherein each of the coordinate pairs contains a first coordinate in relation to the first pulse space dimension and an associated second coordinate in relation to the second pulse space dimension; and activate the MRT scanner to control the MRT scanner to carry out a magnetic resonance scan within the pulse space region to be sampled based on the sampling scheme and respective phase-encodings of the first and second phase-encoded axis, wherein the magnetic resonance scan comprises recording scan signals during associated recording time periods, each recording time period being assigned according to a segmentation scheme to an excitation pulse so that at least one segmentation index is unambiguously assigned to each recording time period.

3. The method as claimed in claim 1, wherein an incomplete sampling is provided along the first pulse space dimension.

4. The method as claimed in claim 1, wherein each recording time period is assigned according to the segmentation scheme to a refocusing pulse so that at least two segmentation indices are unambiguously assigned to each recording time period.

5. The method as claimed in claim 1, wherein performing the magnetic resonance scan comprises assigning each coordinate pair to exactly one tuple of segmentation indices to define a sequence of a sampling of the coordinate pairs during the magnetic resonance scan.

6. The method as claimed in claim 4, wherein performing the magnetic resonance scan comprises assigning each coordinate pair to exactly one tuple of segmentation indices to define a sequence of a sampling of the coordinate pairs during the magnetic resonance scan.

7. The method as claimed in claim 5, wherein at least one gradient moment is applied between samplings of two successive coordinate pairs according to the defined sequence, the value of which is determined from at least one pulse difference between the successive coordinate pairs.

8. The method as claimed in claim 6, wherein at least one gradient moment is applied between samplings of two successive coordinate pairs according to the defined sequence, the value of which is determined from at least one pulse difference between the successive coordinate pairs.

9. The method as claimed in claim 5, wherein between an excitation pulse and a sampling of a subsequent coordinate pair, at least one pre-phasing moment is applied, the value of which is determined from at least one pulse difference between the coordinate pair following the excitation pulse and the at least one reference pulse value.

10. The method as claimed in claim 7, wherein between an excitation pulse and a sampling of a subsequent coordinate pair, at least one pre-phasing moment is applied, the value of which is determined from at least one pulse difference between the coordinate pair following the excitation pulse and the at least one reference pulse value.

11. The method as claimed in claim 5, wherein between a sampling of a coordinate pair and a subsequent further one of the excitation pulses or a refocusing pulse, a re-phasing moment is applied, the value of which is determined from at least one pulse difference between the coordinate pair sampled before the further excitation pulse and the at least one reference pulse value.

12. The method as claimed in claim 1, wherein:
for specifying the pulse space region to be sampled, a third pulse space dimension is assigned to a third phase-encoded axis or a third frequency-encoded axis; and
the magnetic resonance scan is carried out according to a phase-encoding of the third phase-encoded axis or according to a frequency-encoding of the third frequency-encoded axis.

13. The method as claimed in claim 1, wherein, in response to the pulse space region to be sampled being specified, restricting the pulse space region to be sampled along the second pulse space dimension according to a partial Fourier restriction.

14. The method as claimed in claim 1, wherein the magnetic resonance scan is carried out according to a turbo spin echo image acquisition.

15. A non-transitory computer-readable storage medium with an executable program stored thereon, that when executed, instructs a processor to perform the method of claim 1.

16. A computer program product having a computer program which is directly loadable into a memory of the controller of the MRT system, when executed by the controller, causes the MRT system to perform the method as claimed in claim 1.

* * * * *